(12) United States Patent
Chen

(10) Patent No.: US 8,159,619 B2
(45) Date of Patent: Apr. 17, 2012

(54) MULTI-STANDARD INTEGRATED TELEVISION RECEIVER

(75) Inventor: Yu-Tung Chen, Hsin Chu (TW)

(73) Assignee: Sunplus Technology Co., Ltd., Hsin-Chu (TW)

( * ) Notice: Subject to any disclaimer, the term of this patent is extended or adjusted under 35 U.S.C. 154(b) by 413 days.

(21) Appl. No.: 12/574,302

(22) Filed: Oct. 6, 2009

(65) Prior Publication Data

US 2010/0085490 A1  Apr. 8, 2010

(30) Foreign Application Priority Data

Oct. 7, 2008  (TW) ................ 97138491 A

(51) Int. Cl.
*H04N 5/44* (2011.01)

(52) U.S. Cl. ........ 348/725; 348/731; 348/735; 348/737; 348/733; 348/732; 348/508; 348/289; 348/311; 348/342; 348/743; 348/331; 725/151; 725/152; 455/179.1; 455/339

(58) Field of Classification Search .......... 348/725, 348/731, 735, 737, 733, 732, 508, 289, 311, 348/342, 743, 331; 725/151, 152; 455/179.1, 455/339
See application file for complete search history.

(56) References Cited

U.S. PATENT DOCUMENTS

| 4,932,041 A | 6/1990 | Eiberger et al. | |
| 5,628,056 A * | 5/1997 | Grysiewicz et al. | 455/74 |
| 5,715,012 A * | 2/1998 | Patel et al. | 348/555 |
| 6,725,463 B1 | 4/2004 | Birleson | |
| 6,882,207 B2 * | 4/2005 | Fujiyama et al. | 327/307 |
| 7,079,195 B1 | 7/2006 | Birleson et al. | |
| 7,106,388 B2 * | 9/2006 | Vorenkamp et al. | 348/726 |
| 7,236,212 B2 * | 6/2007 | Carr et al. | 348/726 |
| 2001/0008430 A1 * | 7/2001 | Carr et al. | 348/725 |
| 2002/0047942 A1 * | 4/2002 | Vorenkamp et al. | 348/731 |
| 2003/0071925 A1 * | 4/2003 | Kanno et al. | 348/726 |
| 2005/0117071 A1 * | 6/2005 | Johnson | 348/729 |
| 2005/0212977 A1 * | 9/2005 | Zhu et al. | 348/725 |
| 2008/0056417 A1 * | 3/2008 | Chen et al. | 375/350 |
| 2008/0100754 A1 * | 5/2008 | Wang et al. | 348/731 |
| 2008/0225174 A1 * | 9/2008 | Greggain et al. | 348/572 |
| 2008/0225175 A1 * | 9/2008 | Shyshkin et al. | 348/572 |
| 2008/0225176 A1 * | 9/2008 | Selby et al. | 348/572 |
| 2008/0284919 A1 * | 11/2008 | Vorenkamp et al. | 348/735 |
| 2009/0066847 A1 * | 3/2009 | Birleson et al. | 348/725 |
| 2009/0075611 A1 * | 3/2009 | Wada | 455/160.1 |
| 2009/0244397 A1 * | 10/2009 | Aoki et al. | 348/725 |

FOREIGN PATENT DOCUMENTS

TW  480833  3/2002
TW  200718062  5/2007

* cited by examiner

*Primary Examiner* — Jefferey Harold
*Assistant Examiner* — Mustafizur Rahman
(74) *Attorney, Agent, or Firm* — Muncy, Geissler, Olds & Lowe, PLLC

(57) ABSTRACT

A multi-standard integrated television receiver is disclosed. According to the invention, a RF tracking filter is provided to receive a RF signal and then filter out a fifth order and above harmonics and a band-pass filter is provided to further eliminate harmonics. Moreover, a double quadrature mixer is provided to remove third order harmonics. Accordingly, the quality factor requirement of the RF tracking filter and the linearity requirement of the band-pass filter are relaxed. Thus, the RF tracking filter and the band-pass filter can be fully integrated without any external components.

7 Claims, 6 Drawing Sheets

MULTI-STANDARD INTEGRATED TELEVISION RECEIVER

This application claims the benefit of the filing date of Taiwan Application Ser. No. 097138491, filed on Oct. 7, 2008, the content of which is incorporated herein by reference.

BACKGROUND OF THE INVENTION

1. Field of the Invention

The invention relates to television receivers, more particularly, to a multi-standard integrated television receiver.

2. Description of the Related Art

Conventional television receivers employ super-heterodyne architectures with one or two intermediate frequency (IF) stages. Therefore, these television receivers usually include external tracking filters and surface acoustic wave (SAW) filters. Such approaches result in increased power consumption and large number of external components, thus unsuitable for chip integration.

Moreover, a digital television receiver is less sensitive to DC offset and suitable for a Zero-IF architecture with better channel selectivity and no image rejection limitation. In contrast, an analog television receiver is more sensitive to DC offset and thus suitable for a Low-IF architecture, but its image rejection limitation and poorer channel selectivity need to be solved. Many different signal characteristics between analog television signals and digital television signals make the integration of the digital television receiver and the analog television receiver more complex and difficult.

SUMMARY OF THE INVENTION

In view of the above-mentioned problems, an object of the invention is to provide a multi-standard integrated television receiver for analog and digital television signal reception.

To achieve the above-mentioned object, the multi-standard integrated television receiver comprises: a RF synthesizer for generating a first oscillation signal according to a channel and a mode that the television receiver is set; a tracking filter for receiving a RF signal and filtering out a fifth order and above harmonics to generate a filtered signal, wherein the tracking filter dynamically adjusts its central frequency according to the channel; a band-pass filter connected to the tracking filter for filtering out harmonics; a quadrature generator connected to the band-pass filter for generating an in-phase processing signal and a quadrature-phase processing signal, wherein the central frequency of the quadrature generator varies according to the channel; a calibration signal generator for receiving the first oscillation signal and controlling the central frequency of the tracking filter; a phase shifter for receiving the first oscillation signal, performing phase shifting operations and generating an in-phase reference signal and a quadrature-phase reference signal; a double quadrature mixer for receiving the in-phase processing signal, the quadrature-phase processing signal, the in-phase reference signal and the quadrature-phase reference signal, wherein, while the television receiver is set to a digital television reception mode, the double quadrature mixer generates an in-phase baseband signal and a quadrature-phase baseband signal, and wherein, while the television receiver is set to an analog television reception mode, the double quadrature mixer generates an in-phase Low-IF signal and a quadrature-phase Low-IF signal; a polyphase filter unit, wherein, while the television receiver is set to the analog television reception mode, the polyphase filter unit filters out image signals of the in-phase Low-IF signal and the quadrature-phase Low-IF signal, and wherein, while the television receiver is set to the digital television reception mode, the polyphase filter unit directly outputs the in-phase baseband signal and the quadrature-phase baseband signal; a variable gain amplifier unit for amplifying the output of the polyphase filter unit; and, a channel select filter connected to the variable gain amplifier unit for setting a low-pass frequency of the channel select filter according to a channel select signal and generating an output signal.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The multi-standard integrated television receiver of the invention will be described with reference to the accompanying drawings.

A multi-standard integrated television (TV) receiver of the invention has a configurable architecture for analog TV signal reception and digital TV signal reception, able to receive VHF (Very High Frequency, 30~300 MHz) TV RF signals and UHF (Ultra High Frequency, 300~3000 MHz) TV RF signals without external balun. The term "multi-standard" refers to standards able to receive VHF TV RF signals and UHF TV RF signals in analog or digital form.

Figure 1:
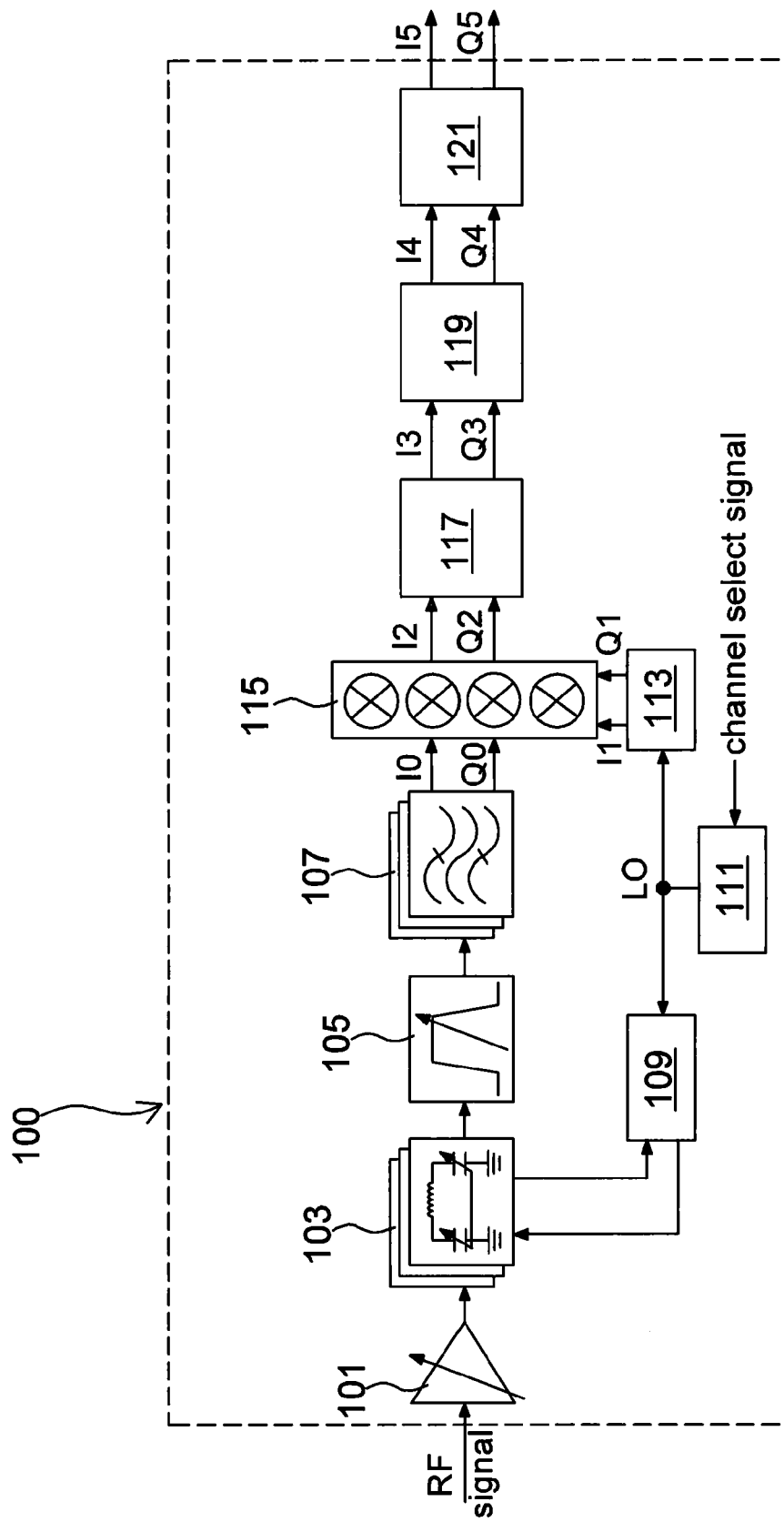
FIG. 1 is a block diagram illustrating an embodiment of the invention.

FIG. 1 is a block diagram illustrating an embodiment of the invention. As shown in FIG. 1, a multi-standard integrated television receiver 100 of the invention includes a low noise amplifier (LNA) 101, a RF tracking filter 103, a band-pass filter 105, a quadrature generator 107, a calibration signal generator 109, a RF synthesizer 111, a phase shifter 113, a double quadrature mixer 115, a polyphase filter unit 117, a variable gain amplifier unit 119 and a channel select filter unit 121. For explicit explanation, all the signal connections shown in FIG. 1 are single-ended interconnections. In practice, some or all of the signal connections can be configured with differential interconnections to improve the noise immunity.

The LNA 101 receives a RF signal (or a broadband TV signal) from an antenna (not shown) and then amplifies it to a proper voltage level. The gain of the LNA 101 is controlled by an automatic gain control (AGC) loop (not shown) and the output of the LNA 101 is transmitted to the quadrature generator 107 via the calibrated RF tracking filter 103 and the calibrated band-pass filter 105. The quadrature generator 107 generates two signals I0 and Q0 in quadrature according to the output of the band-pass filter 105.

After filtering out the $5^{th}$ order and above harmonic signals, the calibrated RF tracking filter 103 transmits the output signal to the band-pass filter 105. The band-pass filter 105 is a configurable active band pass filter and is provided to further reduce the harmonic signals. The linearity requirements of the band-pass filter 105 are relaxed because the tracking filter 103 in the previous stage significantly attenuates the interference signals. Meanwhile, the quality factor requirement of the band-pass filter 105 is also loosened since the double quadrature mixer 115 in the next stage will eliminate the $3^{rd}$ order harmonic signals. Furthermore, the $5^{th}$ order harmonic signals of the channels over 200 MHz is out of the UHF band of the TV signals (42-890 MHz) and should be eliminated by a UHF/VHF preselect filter (not shown) in advance. Therefore, the bandwidth requirement of the band-pass filter 105 can be relaxed and thus its power consumption is reduced.

The quadrature generator 107 can be implemented using a multiple-stage passive polyphase filter. The central frequency of the polyphase filter is programmable by switching different passive components to adapt different required frequency bands. Therefore, the quadrature generator 107 is used to convert the output signal of the band-pass filter 105 into an in-phase signal I0 and a quadrature-phase signal Q0.

The RF synthesizer 111 receives a frequency select signal and then generates a local oscillation (LO) signal according to a mode that the television receiver 100 is set. Here, the frequency select signal is generated according to a channel tuned by a user. In this embodiment, when the television receiver 100 is set to a digital television reception mode that the television receiver 100 serves as a digital television receiver, the system is switched to a Zero-IF architecture and the frequency of the LO signal is set to the tuned channel frequency. When the television receiver 100 is set to an analog television reception mode that the television receiver 100 serves as an analog television receiver, the system is switched to a Low-IF architecture and the frequency of the LO signal is set to several hundred KHz higher than the tuned channel frequency.

Next, the phase shifter 113 shifts the phase of LO signal by 90 degrees to generate two signals I1 and Q1 in quadrature. After receiving the output signals I0 and Q0 of the quadrature generator 107 and the output signals I1 and Q1 of the phase shifter 113, the double quadrature mixer 115 performs down conversion to generate two baseband or Low-IF signals I2 and Q2 in quadrature. When the television receiver 100 is set to the digital television reception mode, the signals I2 and Q2 will be baseband signals. Contrarily, when the television receiver 100 is set to the analog television reception mode, the signals I2 and Q2 will be Low-IF signals.

If the signals I2 and Q2 are Low-IF signals, the polyphase filter unit 117 will eliminate image channels and allow the tuned channel frequency of the signals I2 and Q2 to pass. While I2 and Q2 are baseband signals, the polyphase filter unit 117 will output the signals I2 and Q2 directly. Next, the polyphase filter unit 117 transmits signals I3 and Q3 to the variable gain amplifier 119 and the channel select filter unit 121. Finally, two signals I5 and Q5 are obtained.

The multi-standard integrated television receiver 100 has a configurable architecture which combines the benefits of the zero-IF and the low-IF architectures and thus is suitable to deal with analog and digital TV signals. According to the invention, the architecture of polyphase filter unit 117 and the frequency of the LO signal are switched such that a Zero-IF architecture operates for receiving the digital TV signals and a Low-IF architecture operates for receiving the analog TV signals.

Figure 2:
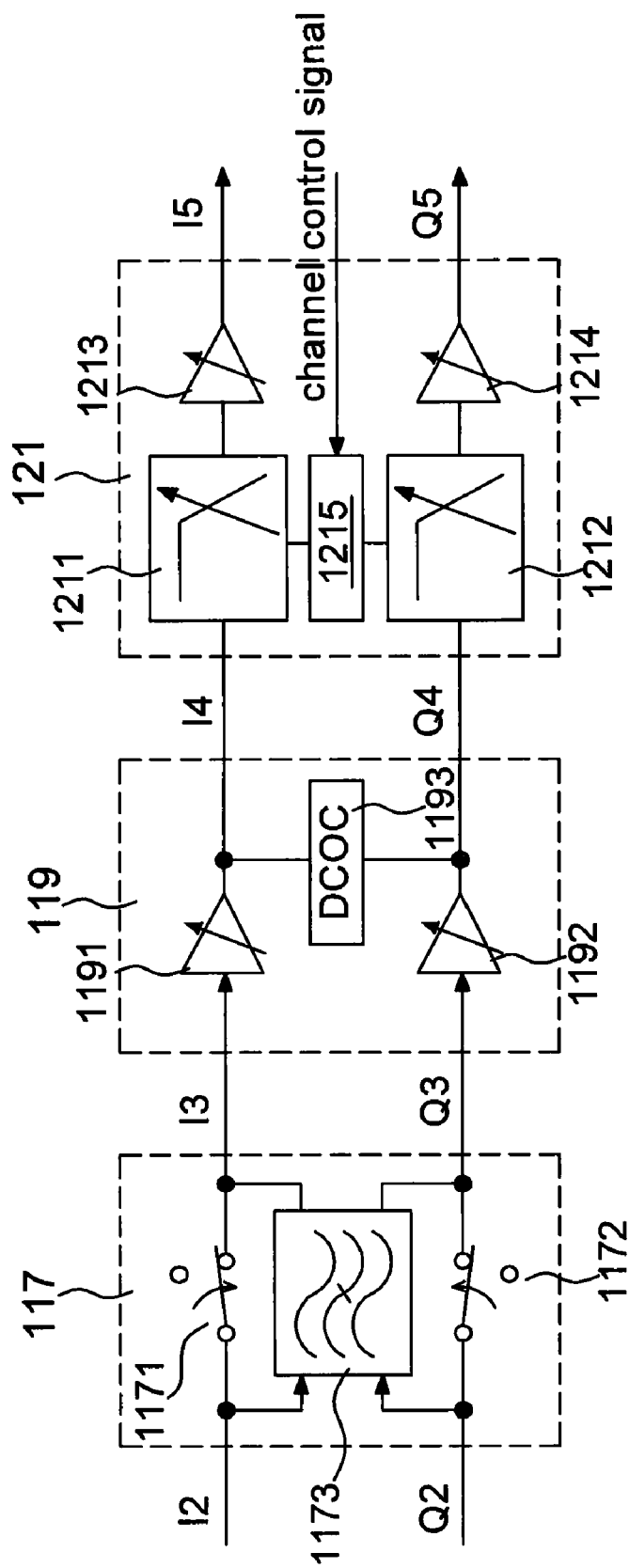
FIG. 2 is a circuit diagram showing an embodiment of a polyphase filter unit, a variable gain amplifier and a channel select filter unit while a multi-standard integrated television receiver serves as a digital television receiver.

FIG. 2 is a circuit diagram showing an embodiment of the polyphase filter unit 117, the variable gain amplifier 119 and the channel select filter unit 121 while the multi-standard integrated television receiver 100 serves as a digital television receiver (i.e., the television receiver 100 is set to the digital television reception mode). At this moment, since the double quadrature mixer 115 down converts an input signal to a baseband signal directly, there is no image interference problem and thus there is no need to use the polyphase filter unit 1173 for operations. Therefore, the switches 1171 and 1172 of the polyphase filter unit 117 are turned on to directly output the signals I2 and Q2 as the signals I3 and Q3. On the other hand, that the double quadrature mixer 115 down converts the input signal into the baseband signal will cause a DC-offset problem and thus the variable gain amplifier unit 119 is provided for compensation. The gains of amplifiers 1191 and 1192 are programmable and can be controlled by a DC offset control loop 1193 to compensate the static offset and the dynamic offset of the in-phase signal path and the quadrature-phase signal path. The channel select filter unit 121 includes two variable frequency low-pass filters 1211 and 1212, two variable gain amplifiers 1213 and 1214, and a channel bandwidth controller 1215. The variable frequency low-pass filters 1121 and 1112 of the channel select filter unit 121 are programmable and their bandwidths are selected based on a channel control signal in order to support multiple television signal standards with different channel bandwidth. The quadrature-phase signal path is configured to be identical to the in-phase signal path. The two signal paths are ideally matched. In practice, a calibration mechanism (not shown) is required to reduce the mismatch between the in-phase signal path and the quadrature-phase signal path, thereby improving the signal quality.

Figure 3A:
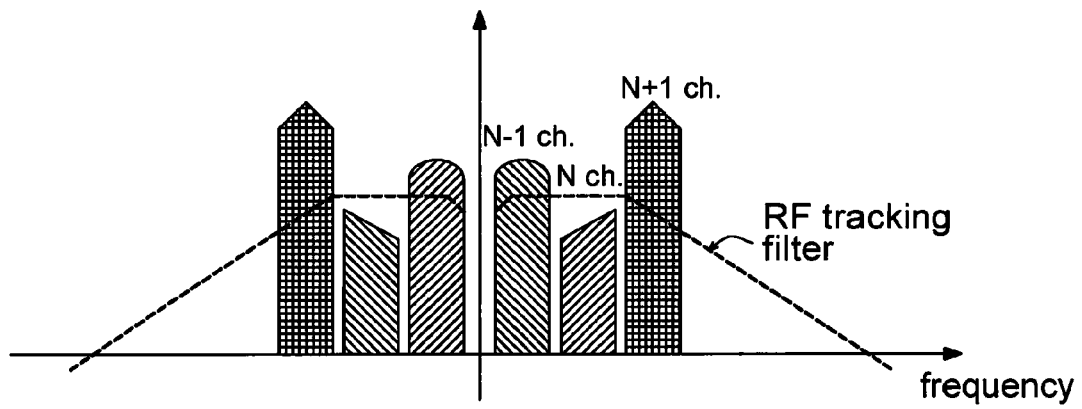
FIG. 3A shows frequency responses of a broadband signal and a RF tracking filter while a multi-standard integrated television receiver serves as a digital television receiver.
Figure 3B:
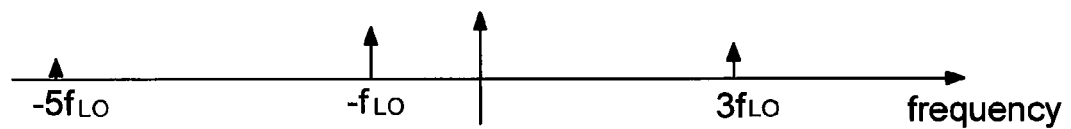
FIG. 3B shows a frequency spectrum of LO signals.
Figure 3C:
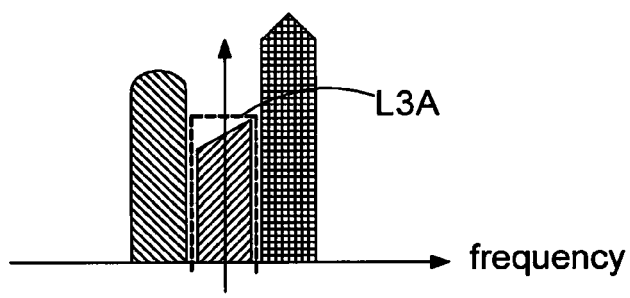
FIG. 3C shows frequency responses of a baseband signal and a channel select filter unit.

FIG. 3A shows frequency responses of a broadband signal and the RF tracking filter 103 while the multi-standard integrated television receiver 100 is set to the digital television reception mode. Assuming that a user tunes into the $N^{th}$ channel, since the double quadrature mixer 115 in the next stage will down convert the input signal into the baseband signal and eliminate the $3^{rd}$ order harmonic signal as well, the RF tracking filter 103 only needs to filter out the $5^{th}$ order and above harmonics of the $N^{th}$ channel frequency in advance. FIG. 3B shows a frequency spectrum of LO signals. As can be observed from FIG. 3B, only the $1^{st}$ and $5^{th}$ order harmonics of the frequency of the LO signals are mixed with broadband signals to be down converted into the baseband signals in the double quadrature mixer 115. FIG. 3C shows frequency responses of the baseband signal and the channel select filter unit 121. Here, the frequency response of the variable frequency low-pass filter 1211 is represented in dotted line L3A.

Figure 4:
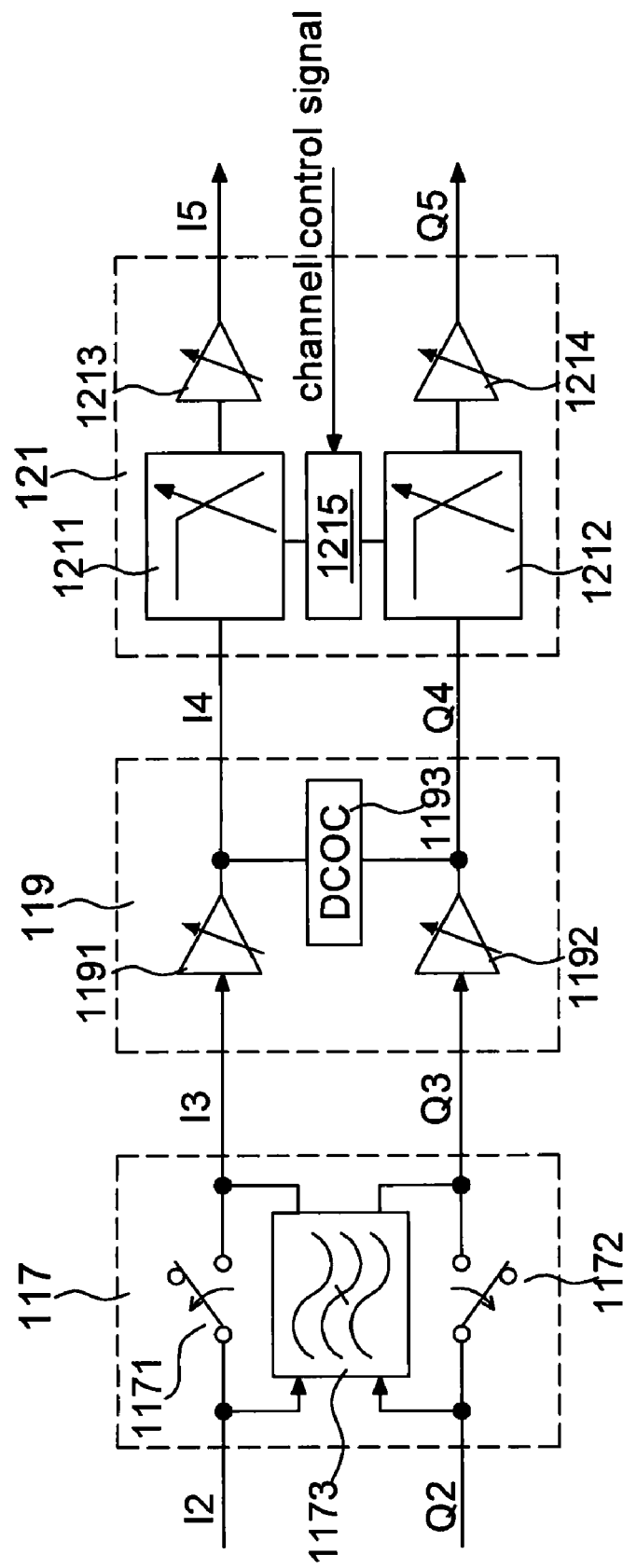
FIG. 4 is a circuit diagram showing an embodiment of a polyphase filter unit, a variable gain amplifier and a channel select filter unit while a multi-standard integrated television receiver serves as an analog television receiver.

FIG. 4 is a circuit diagram showing an embodiment of the polyphase filter unit 117, the variable gain amplifier 119 and the channel select filter unit 121 while the multi-standard integrated television receiver 100 is set to the analog television reception mode. At this moment, a double quadrature mixer 115 down converts the input signal into a Low-IF signal. Although the DC-offset problem caused by the Zero-IF architecture is avoided, the problem of image interference arises instead. Therefore, the polyphase filter 1173 is provided to eliminate image channels. As shown in FIG. 4, the switches 1171 and 1172 of the polyphase filter unit 117 are turned off; thus the polyphase filter unit 1173 receives the signals I2 and Q2 and then eliminates the image interference to generate the signals I3 and Q3. The architectures and functions of the variable gain amplifier unit 119 and the channel select filter unit 121 have been described previously and therefore will not be described herein. Unlike the Zero-IF architecture, the Low-IF architecture confronts a minor problem of DC offset; however, the DC offset control loop 1193 still operates for eliminating the compensation of the static offset due to element mismatches.

Figure 5A:
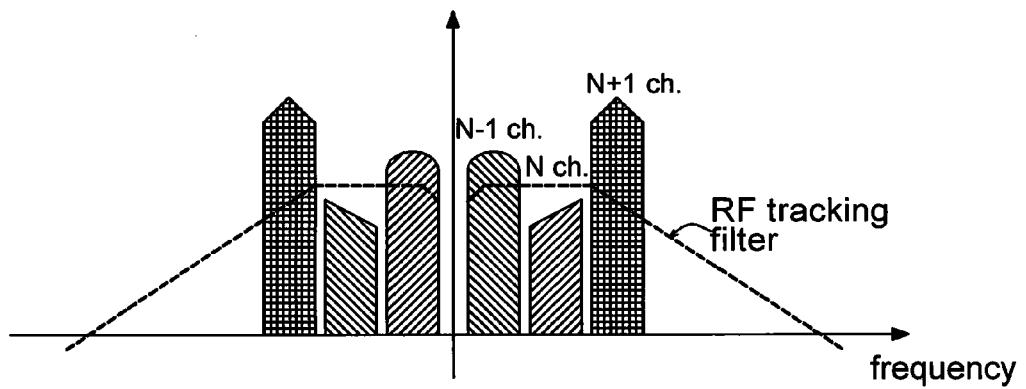
FIG. 5A shows frequency responses of a broadband signal and a RF tracking filter when a multi-standard integrated television receiver serves as analog television receiver.
Figure 5B:
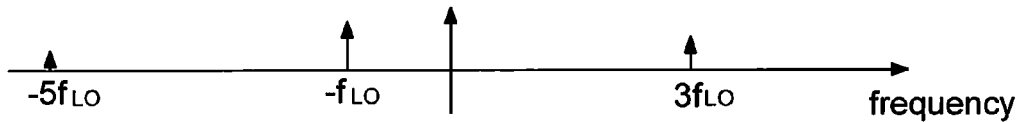
FIG. 5B shows a frequency spectrum of LO signals.
Figure 5C:
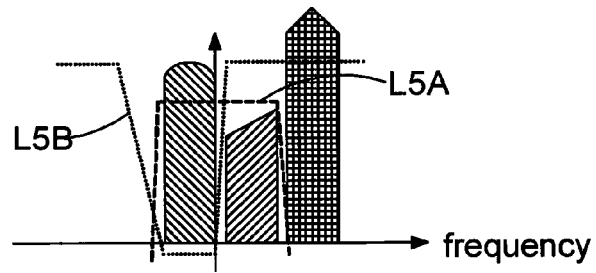
FIG. 5C shows frequency responses of a baseband signal, a polyphase filter and a channel select filter unit.

FIG. 5A shows frequency responses of a broadband signal and the RF tracking filter 103 when the multi-standard integrated television receiver 100 is set to the analog television reception mode. Assuming that a user tunes in to the $N^{th}$ channel, since the double quadrature mixer 115 in the next stage will down convert the input signal into the baseband signal and eliminate the $3^{rd}$ order harmonic signal as well, the RF tracking filter 103 only needs to filter out the $5^{th}$ order and above harmonics of the $N^{th}$ channel frequency in advance. FIG. 5B shows a frequency spectrum of LO signals. As can be observed from FIG. 5B, only the $1^{st}$ and $5^{th}$ order harmonics of the frequency of the LO signals are mixed with broadband signals to be down converted into the baseband signals in the double quadrature mixer 115. FIG. 5C shows frequency responses of the baseband signal, the polyphase filter 1173 and the channel select filter unit 121. Here, the frequency response of the variable frequency low-pass filter 1211 is represented in dotted line L5A and the frequency response of the polyphase filter 1173 is represented in dotted line L5B.

Figure 6:
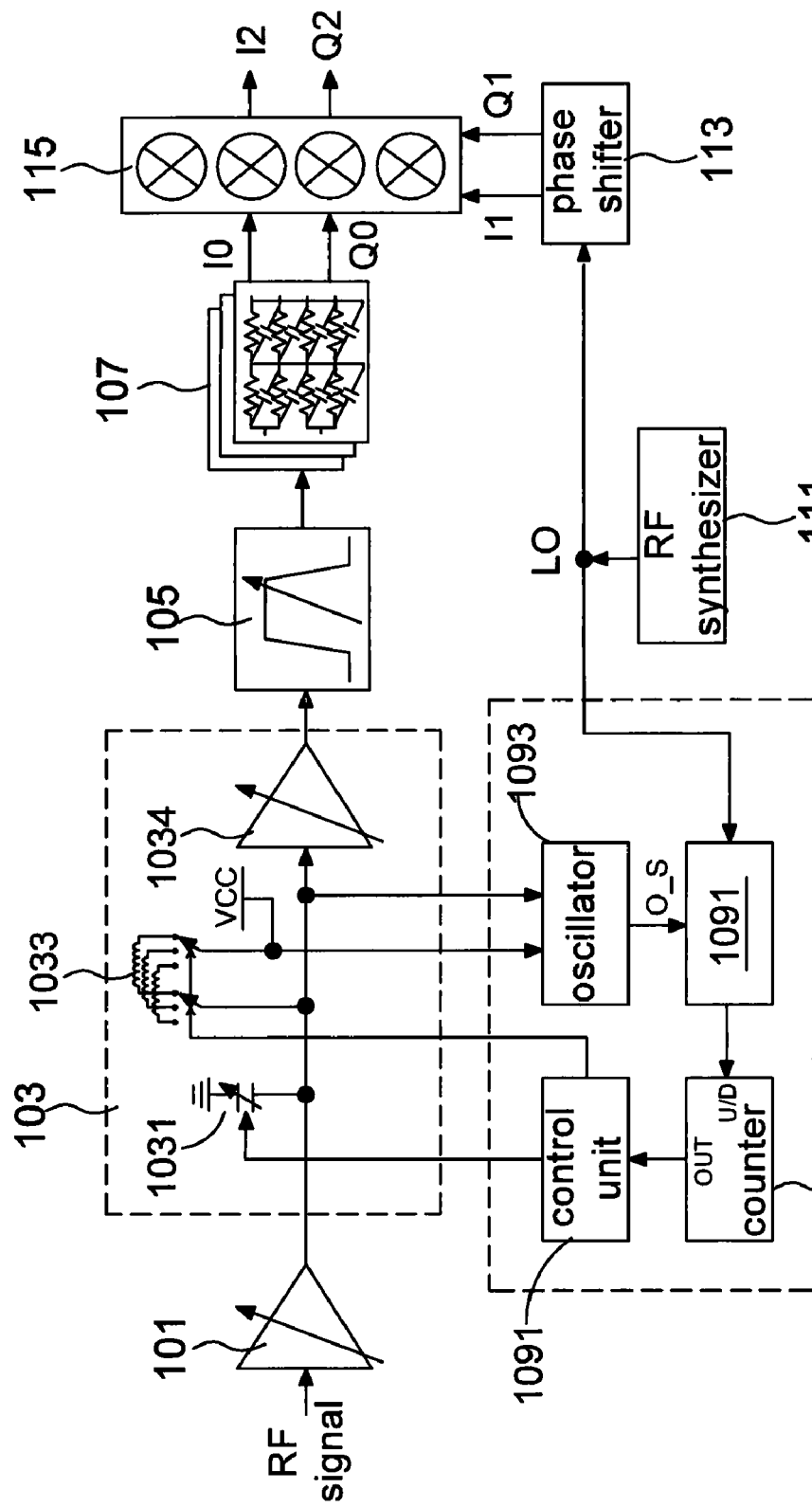
FIG. 6 shows a circuit diagram of a RF tracking filter and a calibration signal generator according to one embodiment of the invention.

FIG. 6 shows a circuit diagram of a RF tracking filter and a calibration signal generator according to one embodiment of the invention. Although all the signal connections shown in FIG. 6 are single-ended interconnections, some or all of the connections can be differential interconnections to improve the noise immunity. Referring to FIG. 6, the RF tracking filter 103 includes a variable capacitor 1031, an inductor unit 1033 and a variable gain amplifier 1034. The center frequency of the RF tracking filter 103 varies according to the tuned channel, and accordingly, the capacitance of the variable capacitor 1031 and the inductance of the inductor unit 1033 are adjusted in order to eliminate the $5^{th}$ order and above harmonic signals of the tuned channel frequency. Since the bandwidth of the VHF TV RF signals and UHF TV RF signals that the multi-standard integrated television receiver 100 receives is wide and ranges from 42 MHz to 890 MHz, the RF tracking filter 103 uses the variable capacitor 1031 and the inductor unit 1033 to achieve such a wide filtering range. The inductor unit 1033 includes a plurality of inductors with different inductance, which are integrated with the variable capacitor 1031 to adjust the center frequency of the RF tracking filter 103. Thus, the capacitance range of the variable capacitor 1031 does not have to be large. The number of the inductors in the inductor unit 1033 depends on the capacitance range of the variable capacitor 1031. Here, both the capacitance of the variable capacitor 1031 and the inductance of the inductor unit 1033 are controlled by the calibration signal generator 109. The variable gain amplifier 1034 is used to compensate the different power loss in the RF tracking filter 103 at the different frequency bands.

A calibration signal generator 109 includes a control unit 1091, an up/down counter 1092, an oscillator 1093 and a frequency comparator 1094. When the television receiver 100 starts calibrating the center frequency of the RF tracking filter 103, RF signals are temporarily disconnected from the RF tracking filter 103, but the calibration signal generator 109 is connected to the RF tracking filter 103 instead and the frequency of the LO signals (the output of the RF synthesizer 111) is set to the center frequency of the RF tracking filter 103. After the television receiver 100 completes the calibration, RF signals are re-sent to the RF tracking filter 103 but the calibration signal generator 109 is disconnected from the RF tracking filter 103. After the RF tracking filter 103 completes the calibration, the center frequency of the RF tracking filter 103 will be equal to the center frequency of the tuned channel. The calibration can be performed each time a channel is tuned in or the system starts up, thus eliminating the process variation and the parasitics of the passive devices. Since the calibration is performed each time a channel is tuned in or the system starts up is executed, no channel alignment is required in the volume production so the production cost is reduced.

The control unit 1091 is used to store and control a desired capacitance and a desired inductor. Accordingly, the control unit 1091 outputs two control signals to the variable capacitor 1031 for generating the desired capacitance and to the inductor unit 1033 for selecting one of the inductors. The method of controlling the capacitance of a variable capacitor is well known to those skilled in the art and need no further description. The oscillator 1093, connected to the RF tracking filter 103, generates an oscillation signal O_S according the capacitance and the inductance set by the RF tracking filter 103. The frequency comparator 1094 compares the frequency of the oscillation signal O_S and the frequency of the local oscillation signal LO and then outputs a comparing signal. When the frequency of the signal O_S is lower than the frequency of the signal LO, the voltage of the comparing signal will be set to a first voltage level. When the frequency of the signal O_S is higher than the frequency of the signal LO, the voltage of the comparing signal will be set to a second voltage level. When the frequency of the signal O_S is equal to the frequency of the signal LO, it indicates the calibration is complete. According to the comparing signal, the up/down counter 1092 performs up/down counting and then outputs the counting value to the control unit 1091 and a borrow signal to the inductor unit 1033 for selecting one of the inductors.

Each time the comparing signal is at the first voltage level, the up/down counter 1092 decrements by one to decrease the counting value to be sent to the control unit 1091, thus reducing the capacitance of the variable capacitor 1031. The frequency of the signal O_S output from the oscillator 1093 goes up since the capacitance of the variable capacitor 1031 is reduced. Each time the comparing signal is at the second voltage level, the up/down counter 1092 increments by one to increase the counting value to be sent to the control unit 1091, thus increasing the capacitance of the variable capacitor 1031. The frequency of the signal O_S output from the oscillator 1093 goes down since the capacitance of the variable capacitor 1031 is increased.

When the capacitance of the variable capacitor 1031 to be adjusted is out of the capacitance range, it is necessary for the control unit 1091 to select another inductor for operations. The frequency of the signal O_S is inversely proportional to the capacitance of the variable capacitor 1031 and the inductance of the inductor unit 1033. Therefore, when the counting value of the up/down counter 1092 exceeds the maximum threshold value, an inductor with greater inductance will be selected in the inductor unit 1033 owing to higher capacitance or inductance is necessary. When the counting value of the up/down counter 1092 is below the minimum threshold value, indicating that less capacitance or inductance is necessary, an inductor with less inductance will be selected in the inductor unit 1033. For example, two comparators are used to compare the counting value of the up/down counter 1092 with the maximum threshold value and the minimum threshold value. An inductor with greater inductance is selected in the inductor unit 1033 if the counting value of the up/down counter 1092 is greater than the maximum threshold limit value; in contrast, an inductor with less inductance is selected in the inductor unit 1033 if the counting value of the counter 1092 is less than the minimum threshold limit value. It should be noted that the example disclosed above is illustrative only, as any circuit able to control the capacitance of the variable capacitor 1031 and select one of the inductors in the inductor unit 1033 according to the counting value can be applied to the invention.

The RF tracking filter 103 is provided to track the tuned channel to greatly reduce the system material cost and PCB area. Meanwhile, interference signals and harmonic signals of a mixer of the next stage are reduced and the linearity requirement of the following stages is also relaxed. In addition, the double quadrature mixer 115 is provided to eliminate the $3^{rd}$ order harmonic signals and the RF tracking filter 103 is provided to eliminate the $5^{th}$ order and above harmonic signals, so the quality requirement for the capacitor bank and the inductor bank of the RF tracking filter 103 is relaxed and the capacitor bank and the inductor bank of the RF tracking filter 103 can be implemented using on-chip monolithic passive elements. Therefore, the RF tracking filter 103 can be completely integrated without any external components.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art. For example, although all the signal connections in the figures are single-ended interconnections, some or all of the signal connections can be configured with differential interconnections to improve the noise immunity.

What is claimed is:

1. An multi-standard integrated television receiver, comprising:
    a RF synthesizer, for generating a first oscillation signal according to a channel and a mode that the television receiver is set;
    a tracking filter, for receiving a RF signal and filtering out a fifth order and above harmonics to generate a filtered signal, wherein the tracking filter dynamically adjusts its central frequency according to the channel;
    a band-pass filter, connected to the tracking filter, for filtering out the harmonics;
    a quadrature generator, connected to the band-pass filter, for generating an in-phase processing signal and a quadrature-phase processing signal, wherein the central frequency of the quadrature generator varies according to the channel;
    a calibration signal generator, for receiving the first oscillation signal and controlling the central frequency of the tracking filter;
    a phase shifter, for receiving the first oscillation signal, performing phase shifting operations and generating an in-phase reference signal and a quadrature-phase reference signal;
    a double quadrature mixer, for receiving the in-phase processing signal, the quadrature-phase processing signal, the in-phase reference signal and the quadrature-phase reference signal, wherein, while the television receiver is set to a digital television reception mode, the double quadrature mixer generates an in-phase baseband signal and a quadrature-phase baseband signal, and while the television receiver is set to an analog television reception mode, the double quadrature mixer generates an in-phase Low-IF signal and a quadrature-phase Low-IF signal;
    a polyphase filter unit, for filtering out image signals of the in-phase Low-IF signal and the quadrature-phase Low-IF signal while the television receiver is set to the analog television reception mode, and outputting the in-phase baseband signal and the quadrature-phase baseband signal while the television receiver is set to the digital television reception mode;
    a variable gain amplifier unit for amplifying the output of the polyphase filter unit; and
    a channel select filter, connected to the variable gain amplifier unit, for setting a low-pass frequency of the channel select filter according to a channel select signal and generating an output signal.

2. The television receiver according to claim 1, wherein the tracking filter comprises:
    a variable capacitor, for controlling its capacitance by the calibration signal generator, wherein one terminal of the variable capacitor receives the RF signal and the other terminal of the variable capacitor is grounded;
    a variable inductor unit, for controlling its inductance by the calibration signal generator, wherein one terminal of the variable inductor unit receives the RF signal and the other terminal of the variable inductor unit is connected to an operating voltage; and
    an operational amplifier, for amplifying the RF signal.

3. The television receiver according to claim 2, wherein the tracking filter is implemented using a single-ended configuration or a differential configuration.

4. The television receiver according to claim 2, wherein the calibration signal generator comprises:
    an oscillator, connected to the operational amplifier for generating a second oscillation signal, wherein the frequency of the second oscillation signal is equal to the central frequency of the tracking filter;
    a frequency comparator, for comparing the frequencies of the first oscillation signal and the second oscillation signal to generate a comparing signal, wherein the comparing signal is set to a first voltage level when the frequency of the second oscillation signal is less than the frequency of the first oscillation signal, otherwise the comparing signal is set to a second voltage level;
    a up/down counter, for performing up/down counting operations according to the comparing signal and outputting a counting value, wherein the up/down counter performs down counting operations when the comparing signal is at the first voltage level, and wherein the up/down counter performs up counting operations when the comparing signal is at the second voltage level; and a control unit for, controlling the capacitance of the variable capacitor and the inductance of the variable inductor unit according to the counting value, wherein the capacitance of the variable capacitor increases as the counting value goes up.

5. The television receiver according to claim 3, wherein the variable inductor unit comprises a plurality of inductors with different inductance.

6. The television receiver according to claim 4, wherein the control unit generates a control signal to increase the inductance of the variable inductor unit when the capacitance is greater than a high threshold value and the control unit generates the control signal to reduce the inductance of the variable inductor unit when the capacitance is less than a low threshold value.

7. The television receiver according to claim 1, further comprising:

a UHF/VHF preselect filter for receiving the RF signal and filtering out the harmonics out of the UHF band.

* * * * *